United States Patent [19]
Lim et al.

[11] Patent Number: 5,617,353
[45] Date of Patent: Apr. 1, 1997

[54] NONVOLATILE SEMICONDUCTOR MEMORY DEVICE

[75] Inventors: Young-Ho Lim; Kang-Deog Suh, both of Kyungki-do, Rep. of Korea

[73] Assignee: Samsung Electronics Co., Ltd., Suwon, Rep. of Korea

[21] Appl. No.: 658,438

[22] Filed: Jun. 5, 1996

Related U.S. Application Data

[62] Division of Ser. No. 350,162, Nov. 30, 1994.

[30] Foreign Application Priority Data

Nov. 30, 1994 [KR] Rep. of Korea ............... 25961/1993

[51] Int. Cl.$^6$ ............................................. G11C 11/40
[52] U.S. Cl. .................. 365/185.17; 365/185.14; 365/185.23; 365/185.2
[58] Field of Search ................ 365/189.01, 230.01, 365/185.01, 185.14, 185.17, 185.2, 185.23

[56] References Cited

U.S. PATENT DOCUMENTS

| | | | |
|---|---|---|---|
| 5,043,942 | 8/1991 | Iwata et al. | 365/185.17 |
| 5,075,890 | 12/1991 | Itoh et al. | 365/189.09 |
| 5,270,969 | 12/1993 | Iwahashi | 365/185.17 |
| 5,295,096 | 3/1994 | Nakajima | 365/185.17 |
| 5,440,509 | 8/1995 | Momodomi et al. | 365/185.17 |
| 5,473,563 | 12/1995 | Suh et al. | 365/185.13 |
| 5,541,879 | 7/1996 | Suh et al. | 365/185.22 |

*Primary Examiner*—Viet Q. Nguyen

[57] ABSTRACT

The present invention provides an electrically erasable and programmable nonvolatile semiconductor memory device (EEPROM) with NAND structured cells which is capable of reducing the number of peripheral circuits required to drive each memory block. The EEPROM according to the present invention includes memory blocks having transfer transistors controlled by a memory block selection signal, wherein the transfer transistors serve as a path through which control gate driving signals are supplied, and wherein control gate driving signals are applied to word lines at full voltage due to a self-boosting operation of each transfer transistor.

1 Claim, 4 Drawing Sheets

NONVOLATILE SEMICONDUCTOR MEMORY DEVICE

This is a divisional of application Ser. No. 08/350,162, filed Nov. 30, 1994.

BACKGROUND OF THE INVENTION

The present invention relates to an electrically erasable and programmable nonvolatile semiconductor memory devices. More particularly, the present invention relates to a nonvolatile semiconductor memory device having NAND gate structured cells.

Recently, electrically erasable and programmable nonvolatile semiconductor memory devices (hereinafter referred to as an EEPROM) have become snore highly integrated. In addition to increasing memory capacity, conventional EEPROMS operate at a lower power supply voltage. To obtain improved memory devices having large capacity and high density, the surface area allocated to peripheral circuits used to drive the memory device has been reduced. This is especially true for decoding circuits used to selectively driving memory cells. One technique used to reduce the number of peripheral circuit has resulted in an EEPROM having row block units, wherein each block shares a decoding circuit. U.S. Pat. No. 5,043,942 teaches one example of this particular technique. Specifically, the memory cell array is arranged in row block units, and each row block shares a control gate driving circuit in order to reduce the area occupied by the associated decoding circuit.

The reduced power supply voltage in the conventional EEPROM often causes difficulty in "reading" data from memory. In particular, the driving voltage applied to the to the word may become lower than the threshold voltage of the memory cell. In order to resolve this problem, the driving voltage must be sufficiently amplified such that it is higher than the memory cell threshold voltage.

FIG. 1 is a circuit diagram showing a portion of a conventional EEPROM having a block decoding circuit. In the FIG. 1, a NAND cell string 10 is connected to a bit line and a ground voltage via first and second string selection transistors ST1 and ST2, respectively. Each NAND cell string includes eight memory cells M1 to M8 having their channels serially connected one to another and their gates respectively controlled by word lines WL1 to WL8. Each memory cell in the cell string is a conventional EEPROM cell having a control gate and a floating gate.

One row block comprises 256 NAND cell strings arranged in a row-wise direction and commonly controlled by the eight word lines. A block selection signal logic 11 receives externally provided block selection decoding information X, Y, and Z. The output of block selection signal logic 11 is commonly applied to first and second string selection logic 12 and 14. First string selection logic 12 includes a NAND gate receiving the block selection signal from block selection signal logic 11, and a string selection signal SD1. Second string selection logic 14 includes a NAND gate receiving the block selection signal from block selection signal logic 11 and a ground selection signal SS1.

The output of first string selection logic 12 is applied to one end of a string selection line SSL via the channel of a depletion type isolation transistor 18 having its gate connected to a control signal $\overline{PRO}$. The output of the second string selection logic 14 is applied to a ground selection line GSL. The string selection line SSL is commonly connected to the gates of first string selection transistors ST1 of the NAND cell strings, thereby serving as a path for a control signal which either connects or isolates the NAND cell string to the bit line. The other end of the string selection line SSL is connected to an output node of a charge pump circuit 20 which outputs a boosting voltage, Vpp. When the string selection line SSL is charged to a logically high level (hereinafter referred to as a "high"), if a clock pulse OSC is applied, charge pump circuit 20 starts a charge pumping operation to raise string selection line SSL to Vpp.

Ground selection line GSL is commonly connected to the gates of the second string selection transistors ST2 of the respective NAND cell strings, thereby serving as a path for the control signal which operates to either connect or isolate the NAND cell string from ground. The control gate terminals of the memory cells in each NAND cell string are commonly connected to respective word lines WL1 to WL8 which, in turn, are connected to the control gate driving signals CG1 to CG8 via corresponding transfer transistors BT1 to BT8.

The gate terminals of transfer transistors BT1 to BT8 are commonly connected a pumping node N1. Pumping node N1 receives the output of first string selection logic 12 via a n-channel isolation transistor 16 having its gate controlled by Vcc, and being connected to the gate of a pump capacitor Cb to which control signal PUSH is applied. Accordingly, pump capacitor Cb operates to pump charge transferred from first string selection logic 12 to pumping node N1 via n-channel isolation transistor 16, thereby raising the potential of pumping node N1.

FIG. 2 is a waveform diagram illustrating a "read" operation for the EEPROM shown in FIG. 1. For the convenience of illustration, FIG. 2 shows, as an example, the reading operation for a first memory cell M1 in the first NAND cell string.

Before a block selection, i.e. before time t1, the output of block selection signal output logic 11 is placed at 0 volts, or a logically low level (hereinafter referred to as a "low"). The outputs of first and second string selection logic 12 and 14 are likewise low. At this time, control signal PUSH applied to pump capacitor Cb, control gate driving signals CG1 to CG8, string selection signal SD1, and ground selection signal SS1 all remain low. As node N1 is low, transfer transistors BT1 to BT8 are all turned OFF, and word lines WL1 to WL8 are allowed to float.

As the block is selected by the block selection decoding information X, Y, Z at time t1, the block selection signal output logic 11 outputs the block selection signal at a logical high, that is at the power supply voltage Vcc. Also at this timge, control gate driving signal CG1 is applied at 0 volts, control gate driving signals CG2 to CG8 are applied at Vcc, and string selection signal SD1 and ground selection signal SS1 are applied Vcc. As string selection signal SD1 and block selection signal are applied at Vcc, the output of first string selection logic 12 moves towards Vcc. Also at this time, a voltage Vcc–Vtn, where Vtn is the threshold voltage of n-channel isolation transistor 16, is applied to pumping node N1 and to the gates of transfer transistors BT1 to BT8. Word line WL1 corresponding to memory cell M1 receives a low (0 volts) via the transfer transistor BT1 which has been turned ON, and the remaining word lines WL2 through WL8 receive Vcc–2Vtn, obtained by subtracting the threshold voltage of the turned-ON transfer transistors BT2 to BT8 from the gate voltage thereof. When the gate of depletion type isolation transistor 18 receives a high from control signal $\overline{PRO}$, string selection line SSL and ground selection line GSL go to Vcc.

When the read operation is started at time t2, control signal PUSH is applied at Vcc level to boost pumping node N1, such that pumping node N1 is boosted to Vcc+Vtn+α by a charge pumping operation of capacitor Cb. The potential of boosted pumping node N1 is applied to the gates of transfer transistors BT1 to BT8, and word lines WL2 to WL8 are thereby charged to Vcc which is the same voltage potential as control gate driving signals CG2 to CG8. Accordingly, memory cells M2 to M8 are mined ON and function as pass transistors, thereby reading out a threshold voltage from the memory cell M1 to bit line BL1. This threshold voltage indicates whether the stored read data of the memory cell M1 is "1" or "0."

Unfortunately, the conventional EEPROM shown in FIG. 1 is disadvantageous in that each memory block has a pump capacitor Cb. Thus, the area occupied by the memory block is larger than it might otherwise be, and a separate circuit is required to supply control signal PUSH to each pump capacitor. That is, the respective pump capacitors Cb are placed in the memory blocks in a one to one arrangement such that the voltage level boosted by the pump capacitors Cb will improve the driving capability of transfer transistors BT1 to BT8. However, this arrangement uses a great amount of surface area. In addition, since control signal PUSH must be applied each pump capacitor Cb, the resulting circuit structures further occupy surface area with peripheral circuits and, thus, lower memory device integration density. Finally, the foregoing problems may become more disadvantageous as memory devices continue to increase in capacity and to increase in the number of the memory blocks.

SUMMARY OF THE INVENTION

In view of the foregoing, it is an object of the present invention to provide a semiconductor EEPROM capable of increased integration and greater density by reducing the area occupied by decoders.

It is another object of the present invention to provide a semiconductor EEPROM capable of obtaining a high word line driving voltage without the use of a separate capacitor.

To achieve the above objects, the preferred embodiment of the present invention is featured in that gate terminals of transfer transistors are connected to a common control node and a block selection signal generated from a block selection part is applied to the common control node, so that a memory block is activated. In particular, the electrically erasable and programmable nonvolatile semiconductor memory device (EEPROM) according to the present invention comprises; at least two memory blocks having at least two NAND cell strings connected between a bit line and a ground voltage via string selection means and ground selection means, each of the NAND cell strings including a predetermined number of memory cells having their channels serially connected one to another and their gate terminals controlled by word lines commonly connecting the NAND cell strings, wherein each of the memory cells includes a control gate and a floating gate, and wherein the word lines receive control gate driving signals via channels of corresponding transfer transistors, block selection logic generating a block selection signal which selects between the memory blocks, and control gate driving logic generating control gate driving signals and applying same to the memory blocks, characterized in that; gates of the transfer transistors are connected to a common control node, and the block selection signal is applied to the common control node.

In addition, the electrically erasable and programmable nonvolatile semiconductor memory device of the present invention comprises the steps of; charging a junction capacitor between gate and source terminals of the transfer transistors with a first voltage by applying the string selection signal and ground selection signal from the control gate driving section to each one of the memory blocks in common, and applying a block selection signal having a first voltage to a common connection node of the gates of the transfer transistors and respective control gate driving signals of a reference potential to one end of the channels of the transfer transistors, and coupling the gate of each of the transfer transistors corresponding to an unselected word lines to make the voltage at the gate terminal higher than a second voltage by applying the remaining control gate driving signals except the control gate driving signal corresponding to the word line selected according to a reading operation with said second voltage higher than said first voltage.

BRIEF DESCRIPTION OF THE DRAWINGS

In the detailed description of the preferred embodiments of the present invention presented below, reference is made to the accompanying drawings, in which.

DETAILED DESCRIPTION OF THE PREFERRED EMBODIMENT

Figure 1:
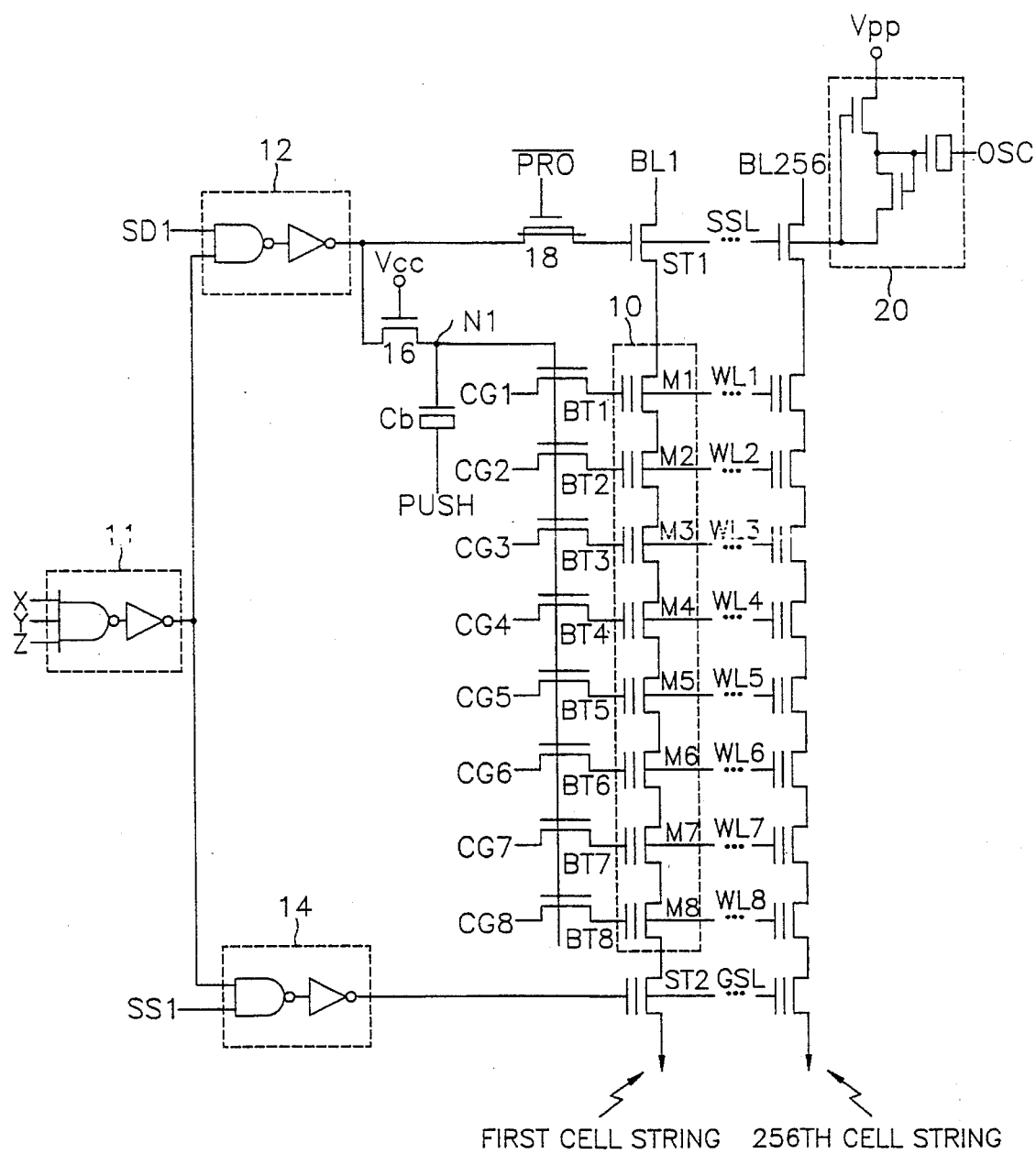
FIG. 1 is a circuit diagram showing a portion of an EEPROM having a conventional block decoding circuit.
Figure 2:
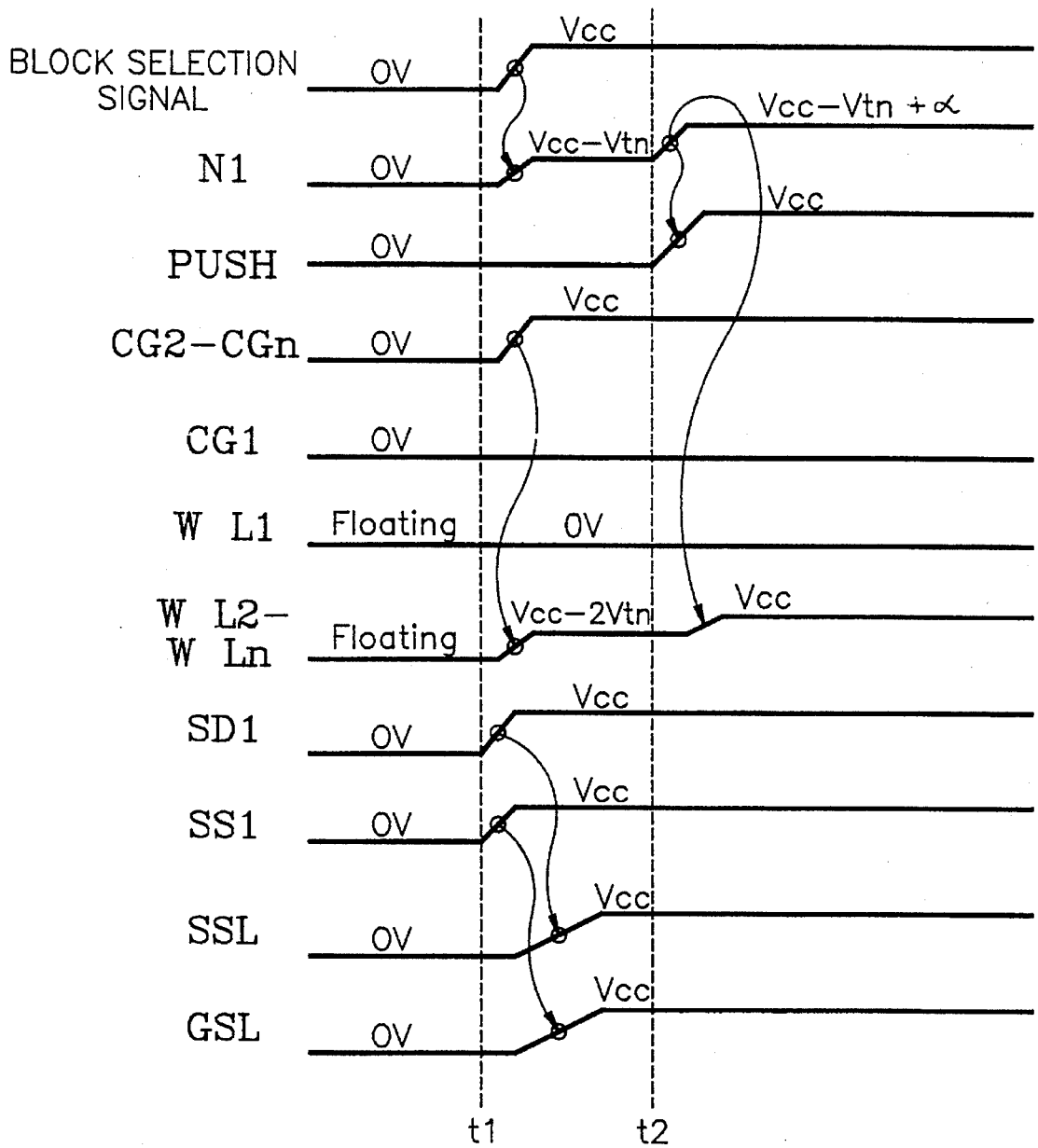
FIG. 2 is a waveform diagram illustrating a read operation for the EEPROM shown in FIG. 1.
Figure 3:
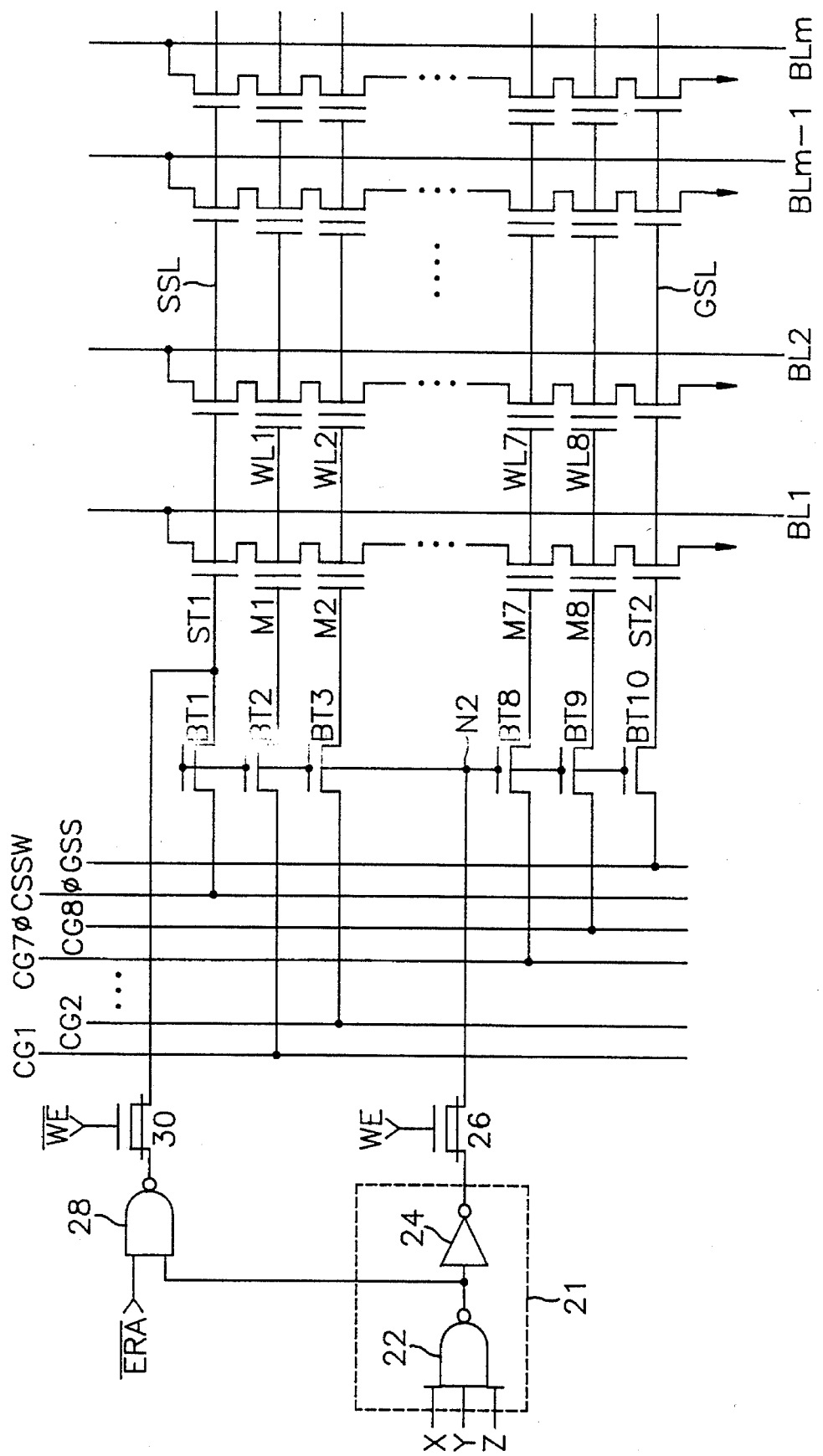
FIG. 3 is a circuit diagram showing a portion of an EEPROM having a block decoding circuit according to the present invention.

FIG. 3 is a circuit diagram illustrating a preferred embodiment of the present invention. FIG. 3 illustrates one row block in EEPROM. Referring to FIG. 3, a NAND cell string to which the present invention applies, comprises eight memory cells M1 to M8 having channels serially connected one to another, having gates controlled to corresponding word lines WL1 to WL8, and coupled to a bit line and a ground voltage via first and second string selection transistors ST1 and ST2, respectively. The row block shown in FIG. 3 comprises, for example, 1st through 256th NAND cell strings controlled in common by the eight common word lines. Each of the memory cells in the respective NAND cell strings is an EEPROM cell having a control gate and a floating gate. The control gates of the memory cells in each NAND cell string are commonly connected to respective word lines WL1 to WL8, which, in turn, are connected to control gate driving signals CG1 to CG8 via corresponding transfer transistors BT1 to BT8. The gates of the transfer transistors BT1 to BT8 are connected in common to a control node N2, which, in turn, is connected to the output node of block selection signal output logic 21 via a depletion type isolation transistor 26 having its gate controlled by a write control signal $\overline{WE}$. The block selection signal output logic 21, which outputs the block selection signal, includes a three-input NAND gate 22 receiving block selection information X, Y, Z and an inverter 24 connected to an output node of NAND gate 22. A NAND gate 28 has a first input receiving an output of three-input NAND gate 22, and a second input receiving an erasing signal $\overline{ERA}$. The output of NAND gate 28 serves as an input to string selection line SSL via a depletion type isolation transistor 30 having a gate controlled by a write control signal. Accordingly, string selection line SSL receives the output of NAND gate 28 and a cell string selection signal φCSS applied via the transfer transistor BT1.

In this arrangement control gate driving signals CG1 to CG8, cell string selection signal φCSS, and a ground selection signal φGSS are commonly applied to all of memory blocks. Also in this arrangement, the gates of transfer transistors BT1 to BT10 are boosted to a boosting voltage by a self-boosting operation.

Figure 4:
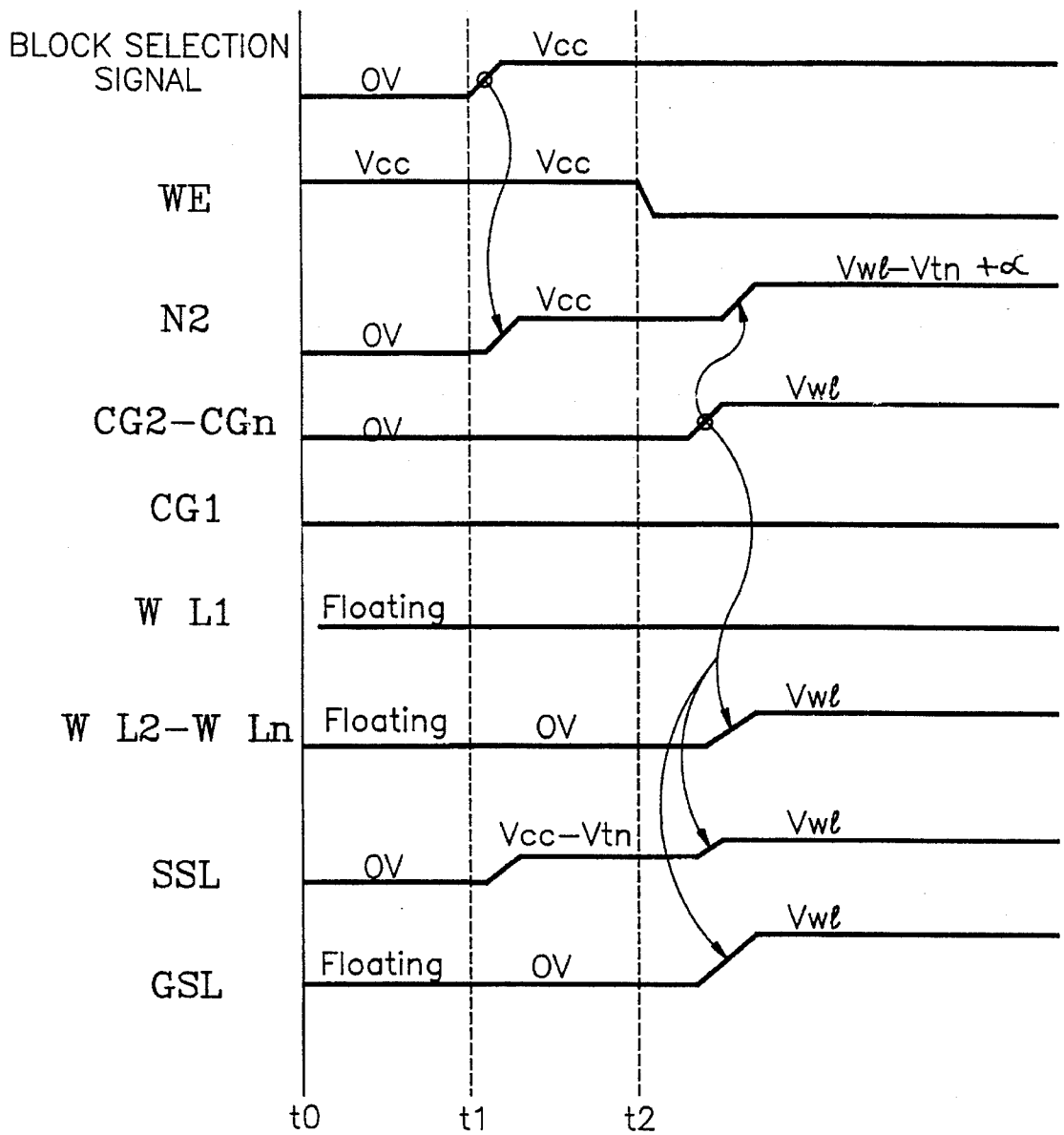
FIG. 4 is a waveform diagram illustrating a read operation of the EEPROM shown in FIG. 3.

FIG. 4 is a waveform diagram showing a "READ" operation for memory cell M1 selected by bit line BL1 and word line WL1 in the memory block shown in FIG. 3.

Before the memory block is selected, i.e. before time t1, block selection signal is low (0 volts), write control signal WE is at the power supply voltage Vcc, and control gate driving signals CG1 to CG8 are also low. Thus, control node N2 is held low, which results in transfer transistors BT1 to BT8 being turned OFF, and word lines WL1 to WL8 and ground selection line GSL are left floating. At this time, the output of NAND gate 28 is low, and string selection line SSL is thus also maintained at 0 volts.

At time t1, as the block selection information X, Y, Z are all applied at highs, the output of NAND gate 22 goes to low, and block selection signal output from inverter 24 accordingly goes high, that is it goes to Vcc. The threshold voltage of depletion type isolation transistor 26, its gate receiving write control signal $\overline{WE}$ at Vcc, is negative. Thus, control node N2 is charged to Vcc. Also at this time, the control gate driving circuit outputs ground selection signal φGSS is at 0 volts, cell string selection signal φCSS is at V(w1), where V(w1) is a boosted Vcc level, and control gate driving signals CG1 to CG8 are at 0 volts. Depletion type isolation transistor 30, receives write control signal WE and has a threshold voltage of −(Vtd). Thus, string selection line SSL is charged to the higher of either Vcc-Vtn or Vtd in consideration of the effect of the threshold voltage Vtn of transfer transistor BT1. Thereupon, all the word lines WL1 to WL8 are discharged to 0 volts. At this time, the junction capacitor between the gate and source of each transfer transistor BT2 to BT9, the channels of which receive the control gate driving signals CG1 to CG8, is charged to Vcc.

When the read operation starts at time t2, write control signal $\overline{WE}$ moves to low (0 volts), and the control gate driving circuit applies the selected control gate driving signal CG1 at 0 volts. The unselected control gate driving signals CG2 to CG8 as well as ground selection signal φGSS are at V(w1). The self-boosting operation of the junction capacitor between the gate and source of each transfer transistors BT2 to BT9, causes control node N2 to be boosted to V(w1)+Vtn, namely, the voltage obtained by adding the voltage V(w1) applied to control gate driving signals CG2 to CG9 to the threshold voltage Vtn of each transfer transistor. Thus, the unselected word lines WL2 to WL8 are charged to V(w1). A voltage high enough to turn ON the memory cells is applied to the control gate terminals such that memory cells M2 to M8 begin to operate as pass transistors. On the other hand, control gate driving signal CG1 corresponding to selected word line WL1 is held at 0 volts. This makes it possible to read data from memory cell M1 via the bit line BL1 corresponding to the selected memory cell.

In the foregoing manner a boosting voltage can be obtained without the need to use a separate pump capacitor. As a result, it is possible to obtain a boosting voltage sufficient for the decoder and which will stably drive the word line without the necessity of increasing the size of the semiconductor memory device. The foregoing embodiment is given by way of example. Various modifications to the specific elements of the exemplary embodiment are contemplated and will be apparent to those of ordinary skill in the art. The present invention is defined by the appended claims.

What is claimed is:

1. A method for reading data in an electrically erasable and programmable nonvolatile semiconductor memory device comprising;

a memory block including a predetermined number of NAND cell strings, each of said NAND cell strings including a predetermined number of memory cells having their channels serially connected one to another and their gates controlled by corresponding word lines, and each of said memory cells having a control gate and a floating gate, said NAND cell strings being connected to a bit line and a ground voltage via string selection means and ground selection means respectively and sharing the word lines, wherein a string selection signal and a ground voltage selection signal are respectively applied to said string selection means and said ground selection means of each of said NAND cell strings, and wherein said word lines receive control gate driving signals from control gate driving means via corresponding transfer transistors, said method comprising the steps of:

charging respective junction capacitors between gate and source of said transfer transistors to a first voltage by applying a block selection signal having said first voltage to a common node connected to the gates of said transfer transistors, and by applying respective control gate driving signals having a reference potential to one end of the channel of said transfer transistors; and, applying a first reference potential to the gate of a selected one of said transfer transistors corresponding to a selected word line, and applying a second voltage to the gates of said transfer transistors other than said selected one of said transfer transistor, such that said common node rises to said second voltage, wherein said second voltage is higher than said first voltage.

* * * * *